United States Patent
Cheng et al.

(10) Patent No.: US 9,105,691 B2
(45) Date of Patent: Aug. 11, 2015

(54) CONTACT ISOLATION SCHEME FOR THIN BURIED OXIDE SUBSTRATE DEVICES

(71) Applicant: International Business Machines Corporation, Armonk, NY (US)

(72) Inventors: Kangguo Cheng, Schenectady, NY (US); Bruce B. Doris, Slingerlands, NY (US); Laurent Grenouillet, Rives (FR); Ali Khakifirooz, Mountain View, CA (US); Yannick C. Le Tiec, Crolles (FR); Qing Liu, Guilderland, NY (US); Maud Vinet, Rives sur Fure (FR)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 13/859,013

(22) Filed: Apr. 9, 2013

(65) Prior Publication Data
US 2014/0302661 A1    Oct. 9, 2014

(51) Int. Cl.
*H01L 21/84* (2006.01)
*H01L 21/00* (2006.01)
*H01L 21/762* (2006.01)

(52) U.S. Cl.
CPC .... *H01L 21/76283* (2013.01); *H01L 21/76237* (2013.01); *H01L 21/84* (2013.01)

(58) Field of Classification Search
None
See application file for complete search history.

(56) References Cited

U.S. PATENT DOCUMENTS

| | | | |
|---|---|---|---|
| 5,616,513 A | 4/1997 | Shepard | |
| 5,902,127 A | 5/1999 | Park | |
| 5,943,578 A * | 8/1999 | Katakabe et al. | 438/359 |
| 6,110,797 A | 8/2000 | Perry et al. | |
| 6,214,698 B1 | 4/2001 | Liaw et al. | |
| 6,242,788 B1 | 6/2001 | Mizuo | |
| 6,251,744 B1 | 6/2001 | Su et al. | |
| 6,255,184 B1 * | 7/2001 | Sune | 438/337 |
| 6,326,261 B1 * | 12/2001 | Tsang et al. | 438/243 |
| 6,413,835 B1 | 7/2002 | Norstrom et al. | |
| 6,426,252 B1 | 7/2002 | Radens et al. | |
| 6,472,702 B1 | 10/2002 | Shen | |
| 6,531,377 B2 | 3/2003 | Knorr et al. | |
| 6,566,177 B1 | 5/2003 | Radens et al. | |

(Continued)

FOREIGN PATENT DOCUMENTS

JP    10056059 A    2/1998

OTHER PUBLICATIONS

PCT International Search Report and Written Opinion; International Application No. PCT/US14/14388; International Filing Date: Feb. 3, 2014; Date of Mailing: May 14, 2014; pp. 1-21.

*Primary Examiner* — Brett Feeney
*Assistant Examiner* — Khanh Duong
(74) *Attorney, Agent, or Firm* — Cantor Colburn LLP; Vazken Alexanian

(57) ABSTRACT

A method of forming a semiconductor-on-insulator (SOI) device includes defining a shallow trench isolation (STI) structure in an SOI substrate, the SOI substrate including a bulk layer, a buried insulator (BOX) layer over the bulk layer, and an SOI layer over the BOX layer; forming a doped region in a portion of the bulk layer corresponding to a lower location of the STI structure, the doped region extending laterally into the bulk layer beneath the BOX layer; selectively etching the doped region of the bulk layer with respect to undoped regions of the bulk layer such that the lower location of the STI structure undercuts the BOX layer; and filling the STI structure with an insulator fill material.

16 Claims, 19 Drawing Sheets

(56) References Cited

U.S. PATENT DOCUMENTS

| | | | |
|---|---|---|---|
| 6,667,226 B2 * | 12/2003 | Pinto et al. | 438/524 |
| 6,690,080 B2 | 2/2004 | Norstrom et al. | |
| 6,797,579 B2 | 9/2004 | Yoo et al. | |
| 6,890,833 B2 | 5/2005 | Belyansky et al. | |
| 7,078,324 B2 | 7/2006 | Dudek et al. | |
| 7,217,604 B2 | 5/2007 | Furukawa et al. | |
| 7,326,983 B2 * | 2/2008 | Steegen et al. | 257/296 |
| 7,446,018 B2 | 11/2008 | Brogan et al. | |
| 7,579,255 B2 | 8/2009 | Pyi | |
| 7,625,776 B2 * | 12/2009 | Wells et al. | 438/68 |
| 7,723,172 B2 | 5/2010 | Ishiguro | |
| 7,750,412 B2 | 7/2010 | Rinehimer | |
| 7,871,893 B2 | 1/2011 | Costrini et al. | |
| 7,902,608 B2 * | 3/2011 | Anderson et al. | 257/368 |
| 7,923,786 B2 * | 4/2011 | Steegen et al. | 257/369 |
| 8,293,615 B2 | 10/2012 | Cheng et al. | |
| 8,445,356 B1 * | 5/2013 | Cai et al. | 438/427 |
| 8,525,292 B2 * | 9/2013 | Cheng et al. | 257/510 |
| 8,536,018 B1 * | 9/2013 | Anderson et al. | 438/430 |
| 8,617,940 B2 * | 12/2013 | Kurz et al. | 438/151 |
| 8,623,732 B2 * | 1/2014 | Grote et al. | 438/369 |
| 8,664,742 B2 * | 3/2014 | Wells et al. | 257/510 |
| 8,673,738 B2 * | 3/2014 | Doris et al. | 438/435 |
| 2003/0104658 A1 | 6/2003 | Furukawa et al. | |
| 2006/0105536 A1 | 5/2006 | Cheng et al. | |
| 2007/0102769 A1 | 5/2007 | Chuang et al. | |
| 2008/0258268 A1 | 10/2008 | Cheng | |
| 2009/0230471 A1 | 9/2009 | Li et al. | |
| 2010/0038744 A1 * | 2/2010 | Li et al. | 257/510 |
| 2010/0065941 A1 | 3/2010 | Wells et al. | |
| 2010/0102373 A1 | 4/2010 | Li et al. | |
| 2010/0258869 A1 * | 10/2010 | Morita et al. | 257/347 |
| 2011/0309333 A1 | 12/2011 | Cheng et al. | |
| 2012/0168863 A1 * | 7/2012 | Zhu et al. | 257/347 |
| 2012/0261792 A1 | 10/2012 | Cheng et al. | |

* cited by examiner

CONTACT ISOLATION SCHEME FOR THIN BURIED OXIDE SUBSTRATE DEVICES

BACKGROUND

The present invention relates generally to semiconductor device manufacturing techniques and, more particularly, to a contact isolation scheme for thin buried oxide substrate devices.

Semiconductor-on-insulator (SOI) devices, such as silicon-on-insulator devices, offer several advantages over more conventional semiconductor devices. For example, SOI devices may have lower power consumption requirements than other types of devices that perform similar tasks. SOI devices may also have lower parasitic capacitances than non-SOI devices. This translates into faster switching times for the resulting circuits. In addition, the phenomenon of latch up, which is often exhibited by complementary metal-oxide semiconductor (CMOS) devices, may be avoided when circuit devices are manufactured using SOI fabrication processes. SOI devices are also less susceptible to the adverse effects of ionizing radiation and, therefore, tend to be more reliable in applications where ionizing radiation may cause operation errors.

On the other hand, SOI devices generally suffer from floating body effects. The body of an SOI FET stores electrical charge as a function of the history of the device, thus changing the body voltage accordingly and becoming a "floating" body. As such, an SOI FET has threshold voltages which are difficult to anticipate and control, and which vary in time. The body charge storage effects result in dynamic sub-threshold voltage (sub-Vt) leakage and threshold voltage (Vt) mismatch among geometrically identical adjacent devices. Floating body effects in an SOI field effect transistor are particularly a concern in static random access memory (SRAM) cells, where Vt matching is extremely important as operating voltages continue to be scaled down.

An evolution beyond the standard FET (which has a single top gate that controls the FET channel) is the double-gated FET, in which the channel is confined between a top and a bottom gate. Positioning the channel between a top gate and a bottom gate allows for control of the channel by the two gates from both sides of the channel, reducing short channel effects. Further, a double-gated FET may exhibit higher transconductance and reduced parasitic capacitance as compared to a single-gated FET. The presence of the back gate allows for enhanced on-chip power management and device tuning. Multiple threshold voltage (Vt) devices may also be achieved on a single IC chip by applying different back biases at the back gates of various devices.

An SOI substrate includes a bottom substrate underneath a buried oxide (BOX) layer, with a top layer of a semiconductor material located over the BOX. As indicated above, the presence of the BOX in an SOI device may produce a relatively fast FET device by reducing the capacitance between the source/drain regions of the FET devices on the top semiconductor layer and the bottom substrate. The channel regions of the FET devices, which are located between the source/drain regions, may be decoupled from the bottom substrate by the BOX, allowing movement of the channel region potential with respect to the bottom substrate. For example, when the channel region potential floats positive, the threshold voltage of the FET drops, thereby increasing the FET device drive current. It is also easier to intentionally modulate Vt with a thinner BOX. Because the BOX is thinner, less voltage on the back gate is needed to change Vt by a given amount relative to the case where the BOX is thicker. This capability is particularly desirable for mobile applications where the power supply may be limited to low voltages.

A difficulty encountered with SOI devices is determining an appropriate BOX thickness. The capacitance between the source/drain regions and the bottom substrate increases as the thickness of the BOX layer is decreased, which may increase the circuit loading. However, the amount of channel region potential movement increases with increasing thickness of the BOX layer due to the reduced capacitance coupling to the substrate, which may result in floating channel regions. A floating channel region may have the effect of producing a fluctuating FET threshold voltage, and therefore an unpredictable device. Accordingly, UTBB (ultrathin body and BOX) devices may have a relatively thin BOX layer, preventing floating channel regions in a UTBB SOI device. In addition, UTBB devices are also is better for Vt modulation in mobile chip applications.

SUMMARY

In an exemplary embodiment, a method of forming a semiconductor-on-insulator (SOI) device includes defining a shallow trench isolation (STI) structure in an SOI substrate, the SOI substrate including a bulk layer, a buried insulator (BOX) layer over the bulk layer, and an SOI layer over the BOX layer; forming a doped region in a portion of the bulk layer corresponding to a lower location of the STI structure, the doped region extending laterally into the bulk layer beneath the BOX layer; selectively etching the doped region of the bulk layer with respect to undoped regions of the bulk layer such that the lower location of the STI structure undercuts the BOX layer; and filling the STI structure with an insulator fill material.

In another embodiment, a method of forming a semiconductor-on-insulator (SOI) device includes defining a shallow trench isolation (STI) structure in an SOI substrate, the SOI substrate including a bulk layer, a buried insulator (BOX) layer over the bulk layer, and an SOI layer over the BOX layer; forming a doped region in a portion of the bulk layer corresponding to a lower location of the STI structure, the doped region extending laterally into the bulk layer beneath the BOX layer, by forming a dopant source layer within the STI structure and on an exposed top surface of the bulk layer and annealing to out-diffuse the dopant atoms from the dopant source layer; selectively etching the doped region of the bulk layer with respect to undoped regions of the bulk layer such that the lower location of the STI structure undercuts the BOX layer; filling the STI structure with an insulator fill material; and forming field effect transistor (FET) source/drain contact structures over the SOI substrate, wherein any overlap of a source/drain contact structure with the STI structure is prevented from forming a short circuit to the bulk layer due to the undercutting of the STI structure beneath the BOX layer.

In another embodiment, a method of forming a semiconductor-on-insulator (SOI) device includes defining a shallow trench isolation (STI) structure in an SOI substrate, the SOI substrate including a bulk layer, a buried insulator (BOX) layer over the bulk layer, and an SOI layer over the BOX layer; forming a doped region in a portion of the bulk layer corresponding to a lower location of the STI structure, the doped region extending laterally into the bulk layer beneath the BOX layer, by forming a dopant source layer within the STI structure and on an exposed top surface of the bulk layer and annealing to out-diffuse the dopant atoms from the dopant source layer; selectively etching the doped region of the bulk layer with respect to undoped regions of the bulk layer such that the lower location of the STI structure undercuts the BOX layer; filling the STI structure with an insulator fill material; and forming field effect transistor (FET) source/drain contact structures over the SOI substrate, wherein any overlap of a source/drain contact structure with the STI structure is prevented from forming a short circuit to the bulk layer due to the undercutting of the STI structure beneath the BOX layer.

BRIEF DESCRIPTION OF THE SEVERAL VIEWS OF THE DRAWINGS

Referring to the exemplary drawings wherein like elements are numbered alike in the several Figures:

FIGS. 2 through 10 are a series of cross sectional views illustrating a method of isolating a back gate contact for thin buried oxide substrate devices in accordance with an exemplary embodiment, in which:

FIG. 2 illustrates a starting SOI substrate including a bulk layer, thin BOX layer and thin SOI layer;

FIG. 3 illustrates the formation of a pad oxide and a pad nitride on the starting SOI substrate;

FIG. 4 illustrates the formation of a shallow trench, down to the level of the bulk layer;

FIG. 5 illustrates doping of the exposed portion of the bulk layer to formed a doped region;

FIG. 6 illustrates an annealing procedure to out-diffuse the doped region further into the bulk layer;

FIG. 7 illustrates selective etching of the doped region of the bulk layer with respect to undoped portions;

FIG. 8 illustrates filling of the resulting STI recess with an insulation layer;

FIG. 9 illustrates planarizing of the structure of FIG. 8, to the level of the SOI layer;

FIG. 10 illustrates FET and source/drain contact formation in which the bottom portion of the source/drain contact is isolated from the bulk layer;

FIGS. 11 through 21 are a series of cross sectional views illustrating a method of isolating a back gate contact for thin buried oxide substrate devices in accordance with another exemplary embodiment, in which:

FIG. 11 illustrates the formation of a shallow trench, down to a mid portion of the BOX layer;

FIG. 12 illustrates the formation of a spacer layer over the structure of FIG. 11;

FIG. 13 illustrates anisotropic etching of the spacer layer to form sidewall spaces in the shallow trench;

FIG. 14 illustrates continued etching of the shallow trench into the bulk layer;

FIG. 15 illustrates formation of a dopant source layer over the structure of FIG. 14;

FIG. 16 illustrates out-diffusion of dopant material in the dopant source layer into the bulk layer;

FIG. 17 illustrates removal of the dopant source layer;

FIG. 18 illustrates selective etching of the doped region of the bulk layer with respect to undoped portions;

FIG. 19 illustrates filling of the resulting STI recess with an insulation layer;

FIG. 20 illustrates planarizing of the structure of FIG. 19, to the level of the SOI layer; and FIG. 21 illustrates FET and source/drain contact formation in which the bottom portion of the source/drain contact is isolated from the bulk layer.

DETAILED DESCRIPTION

Figure 1:
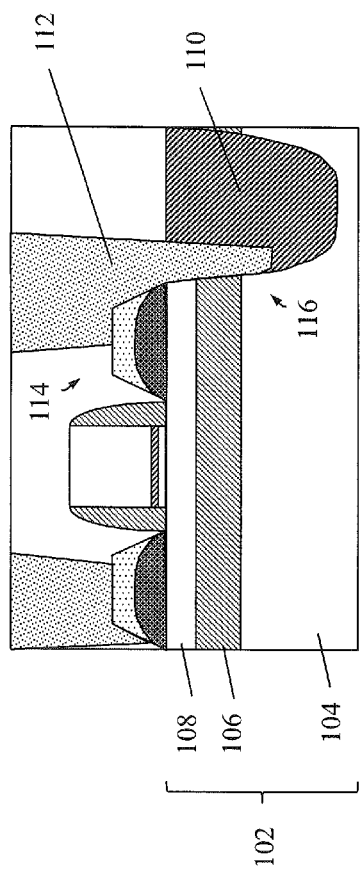
FIG. 1 illustrates an example of a short occurring between a source/drain contacts of an FET device and the bottom (bulk) substrate of having a relatively thin BOX layer.

In UTBB devices having a relatively thin BOX layer, shorts may occur between the source/drain contacts of the FET devices and the bottom (bulk) substrate in the event that the source/drain contacts break through the BOX layer to the bottom substrate. FIG. 1 illustrates such an example, in which an SOI substrate 102 includes a bulk substrate layer 104, a thin BOX layer 106 (e.g., 10-20 nanometers (nm)) on the bulk substrate layer 104, and a thin SOI layer 108 on the BOX layer 106. As known in the art, shallow trench isolation (STI) regions 110 are formed to electrically isolate active device areas from one another. In the example depicted, a metallized source/drain contact 112 may be slightly misaligned with respect to the associated source/drain region (generally indicated at 114) and break through the BOX layer 106 so as to be in close proximity or in actual contact with the bulk substrate layer 104 (which may serve as a back gate layer), thus creating a short circuit condition at 116. Specifically, the corner of the silicon is difficult to remove by dry etching and also by oxidation methods, and it is this corner region that most typically forms the point of contact for a back gate short to the source/drain contact.

Accordingly, disclosed herein are methods for preventing unwanted electrical connections (shorts) between source/drain regions and back gates (bulk substrate) in UTTB structures. As described in further detail below, the present embodiments address this issue by forming a doped region that is subsequently out-diffused in an anisotropic manner. The doped region is selectively removed using a dry etch process, and thereafter the resulting undercut isolation regions in the bottom substrate are filled with an insulating material to provide a relatively thick insulator at edge of the active regions, thereby isolating the source/drain contacts from the bottom substrate and preventing such shorts.

The undercut isolation regions include a thick dielectric at the edge of the channel; this dielectric extends into the bottom substrate underneath the source/drain regions. Undercut isolation regions may be formed by undercutting into the bottom substrate and filling with the dielectric material, and additionally by oxidation of the silicon that comprises the bottom substrate before filling with the dielectric material, in various embodiments.

Referring generally now to FIGS. 2 through 10, there are shown a series of cross sectional views a method of isolating a back gate contact for thin buried oxide substrate devices in accordance with an exemplary embodiment.

Figure 2:
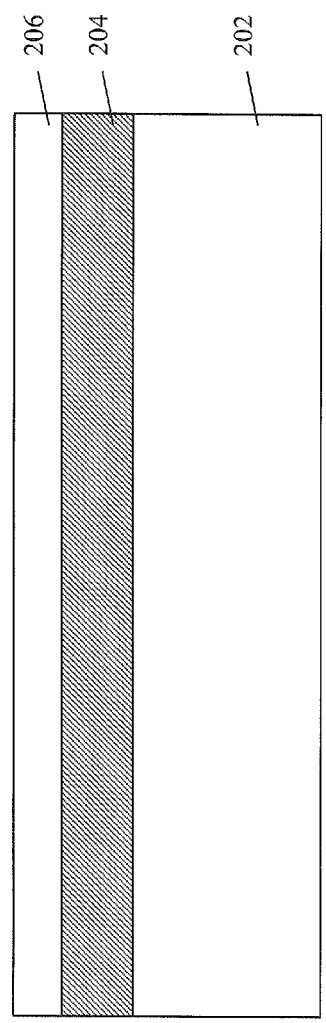

As shown in FIG. 2, a starting substrate 200 includes a bulk semiconductor layer 202, a buried insulator (e.g., oxide) (BOX) layer 204 formed on the bulk semiconductor layer 202, and an active thin SOI layer 206 formed on the BOX layer 204. The semiconductor substrate material of the bulk layer 202 and/or the SOI layer 206 may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

In addition, while the exemplary embodiments are described in terms of a thin SOI device (e.g., the SOI layer 206 is on the order of about 10 nm or less) and a thin BOX layer (e.g., about 10-20 nm), it should be appreciated that the principles described herein are equally applicable to substrates of varying materials and thicknesses.

Figure 3:
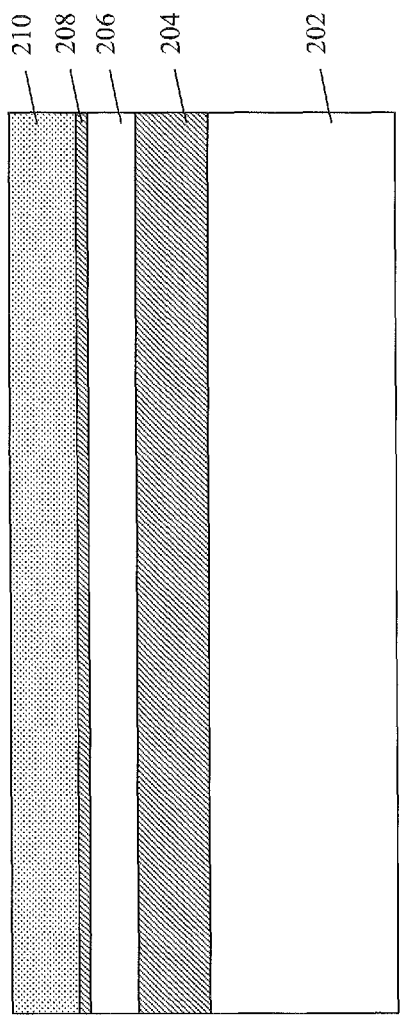
Figure 4:
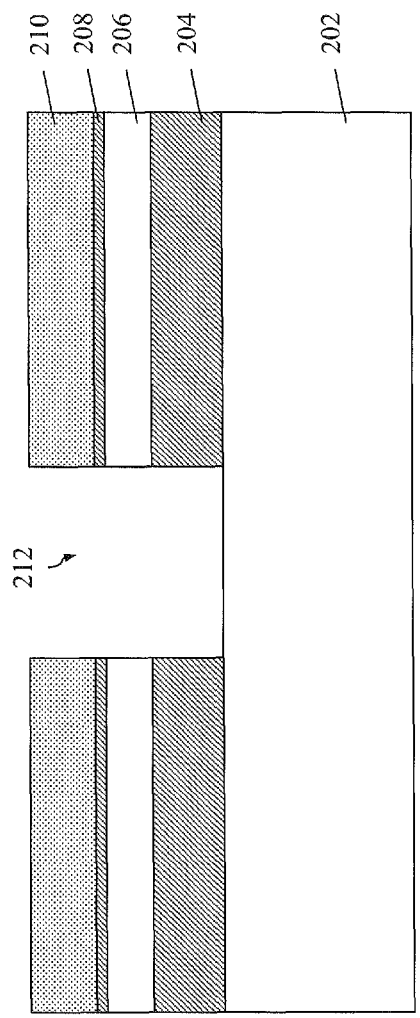
Figure 5:
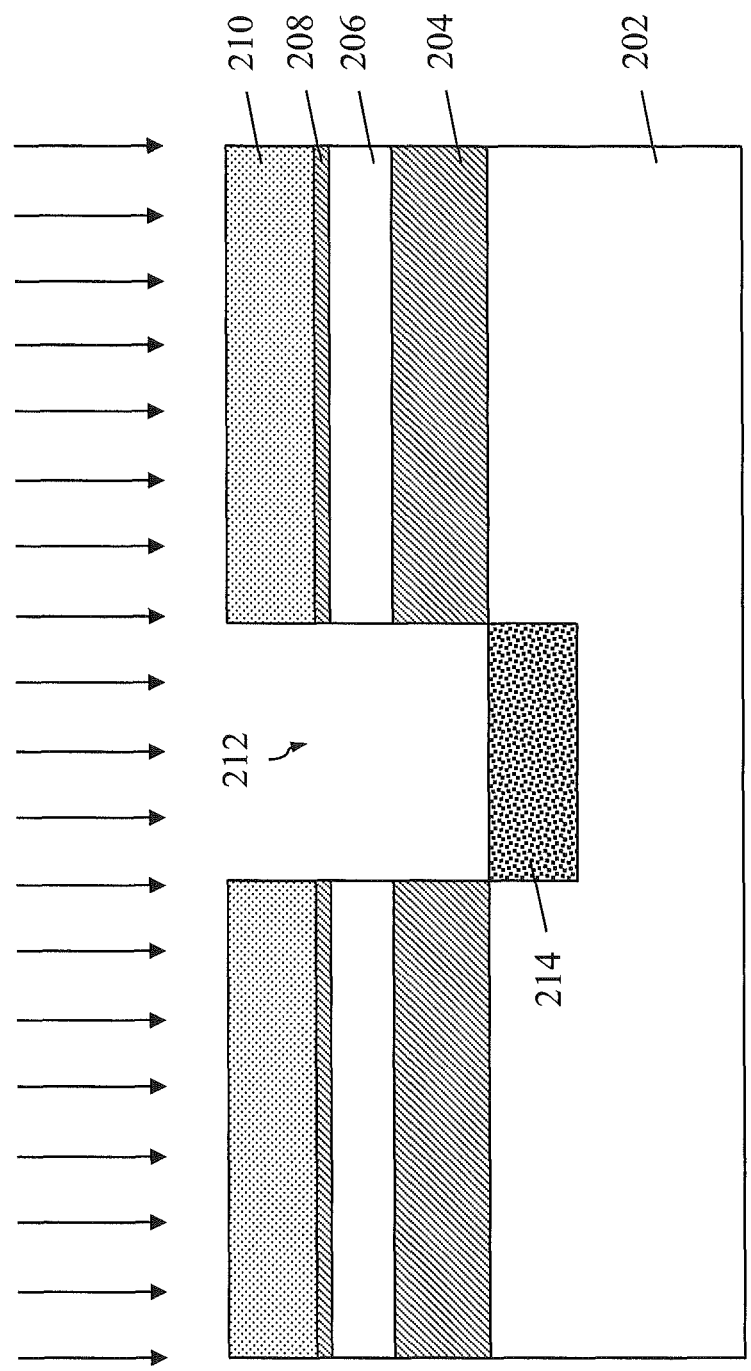

FIG. 3 illustrates the formation of a pad oxide 208 and a pad nitride 210, respectively on the starting SOI substrate. The pad oxide 208 may, for example, be thermally grown and the pad nitride 210 may, for example, be deposited. As shown in FIG. 4, standard photolithography and dry etching processes are used to form a shallow trench structure 212, down to the level of the bulk layer 202. Such shallow trench structures isolate active areas of the top SOI layer from one another, and extend through the top SOI layer and BOX, into the bottom substrate. Then, as shown in FIG. 5, the structure is subjected to a dopant implantation process (indicated by the arrows) so as to dope the exposed portion of the bulk layer 202 and form a doped region 214. In an exemplary embodiment, the doped region 214 comprises an n-type dopant such as phosphorous (P) and arsenic (As), for example.

Figure 6:
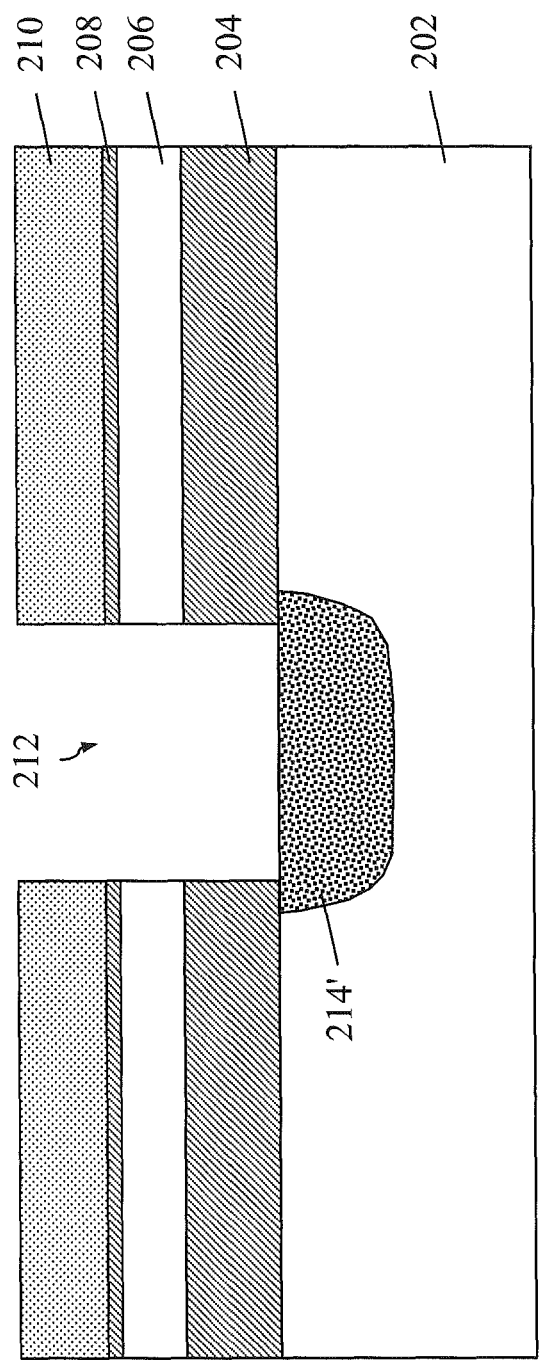
Figure 7:
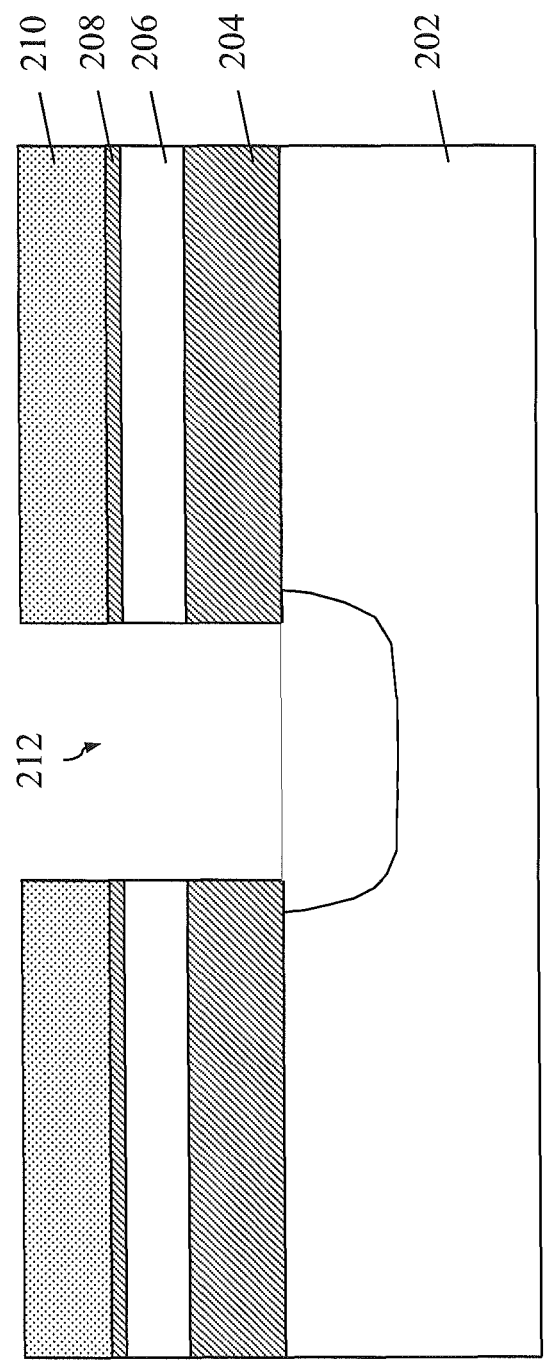

FIG. 6 illustrates an annealing procedure to out-diffuse the doped region 214 further into the bulk layer 202 and, notably, beneath the BOX layer 204. The diffused doped region is denoted as 214' in FIG. 6. Then, as shown in FIG. 7, a dry etch process is used to selectively remove the diffused doped region 214', thereby widening the bottom of the shallow trench structure 212 so that it undercuts the BOX layer 204. An etch chemistry is selected that may remove n-typed doped silicon selectively with respect to undoped silicon.

Figure 8:
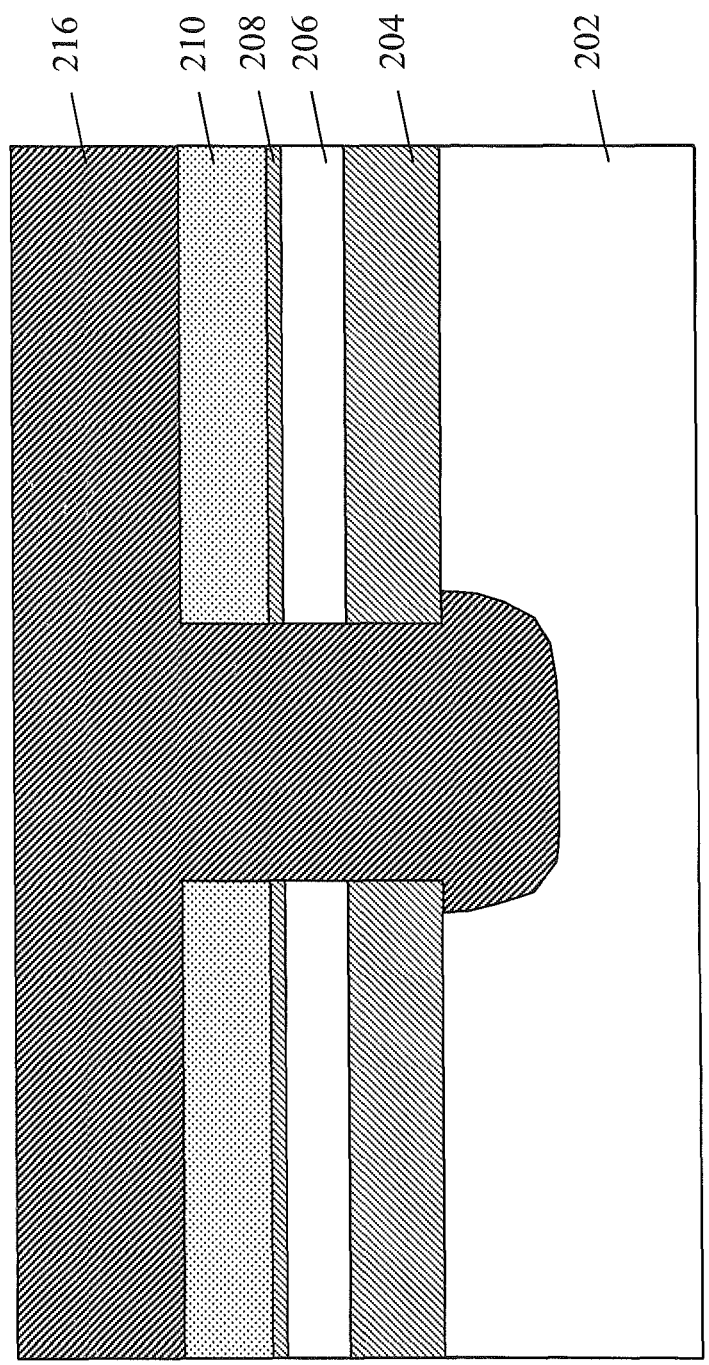
Figure 9:
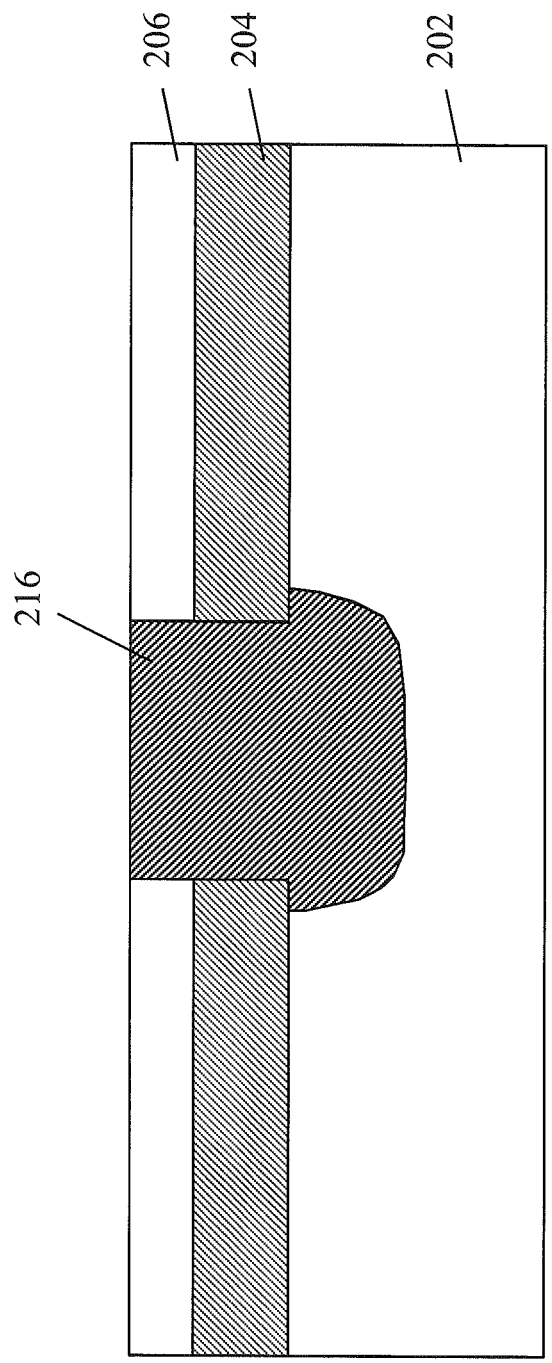
Figure 10:
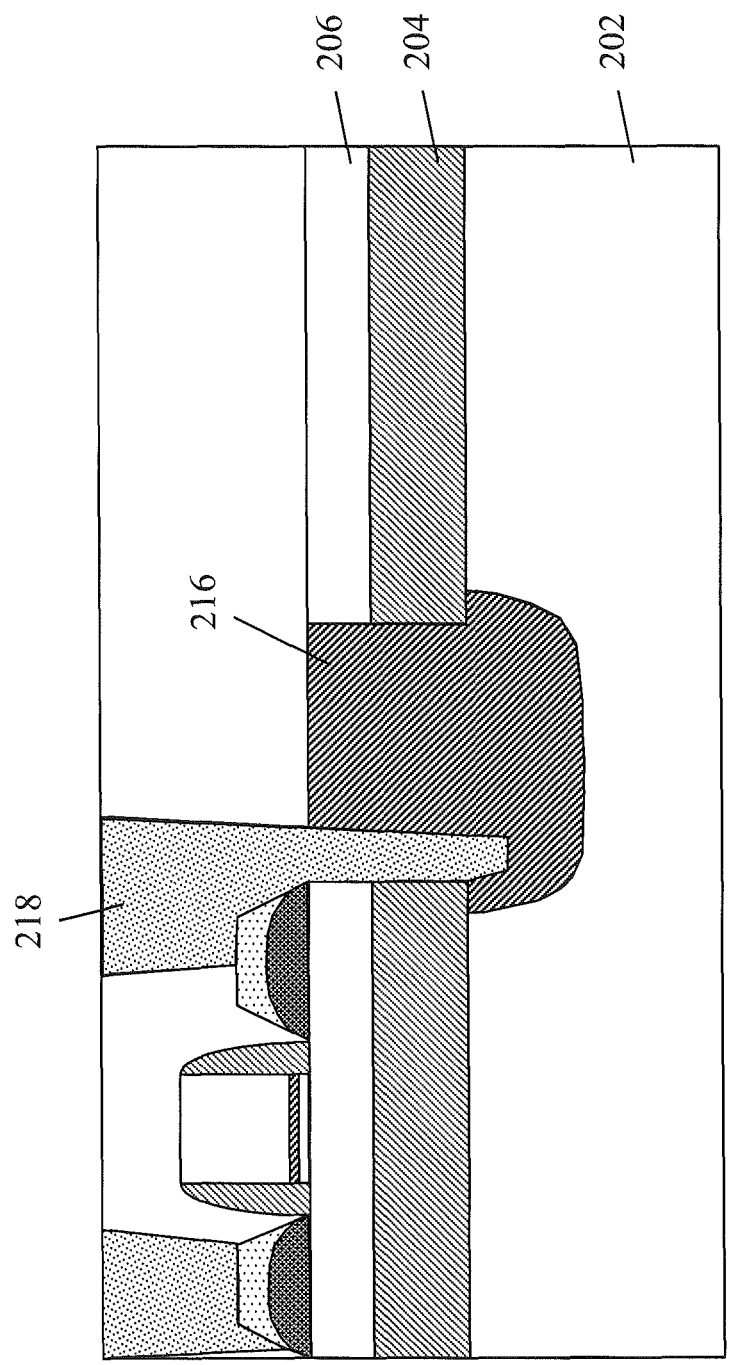

In FIG. 8, a shallow trench insulator fill material 216 (e.g., oxide) is formed within the STI recess and over top surfaces of the structure. This is followed by a planarizing operation (e.g., chemical mechanical polishing (CMP)) to remove excess fill material, as well as the pad nitride layer 210 and pad oxide layer 208, stopping on the SOI layer 206. The resulting structure is depicted in FIG. 9. Then, as illustrated in FIG. 10, FET and source/drain contact formation is carried out as known in the art. In comparison to FIG. 1, it will be noted that in the case of a slight misalignment of the source/drain contact 218 and/or overetching of STI material 216 at the active area boundary, the increased width of the bottom portion of the STI structure effectively isolates the lower portion of the source/drain contact 218 from shorting to the bulk layer 202. Moreover, since this widened region is formed through selective etching of a diffused doped region (instead of lateral recessing of undoped silicon), the corner region of the lower portion of the STI structure is more reliably defined.

In lieu of dopant ion implantation to provide a dopant source for bottom STI widening, other processes are also contemplated. Referring generally now to FIGS. 11 through 21, there are shown a series of cross sectional views illustrating a method of isolating a back gate contact for thin buried oxide substrate devices in accordance with another exemplary embodiment. For ease of illustration, like elements are designated with the same reference numerals in the embodiments.

Figure 11:
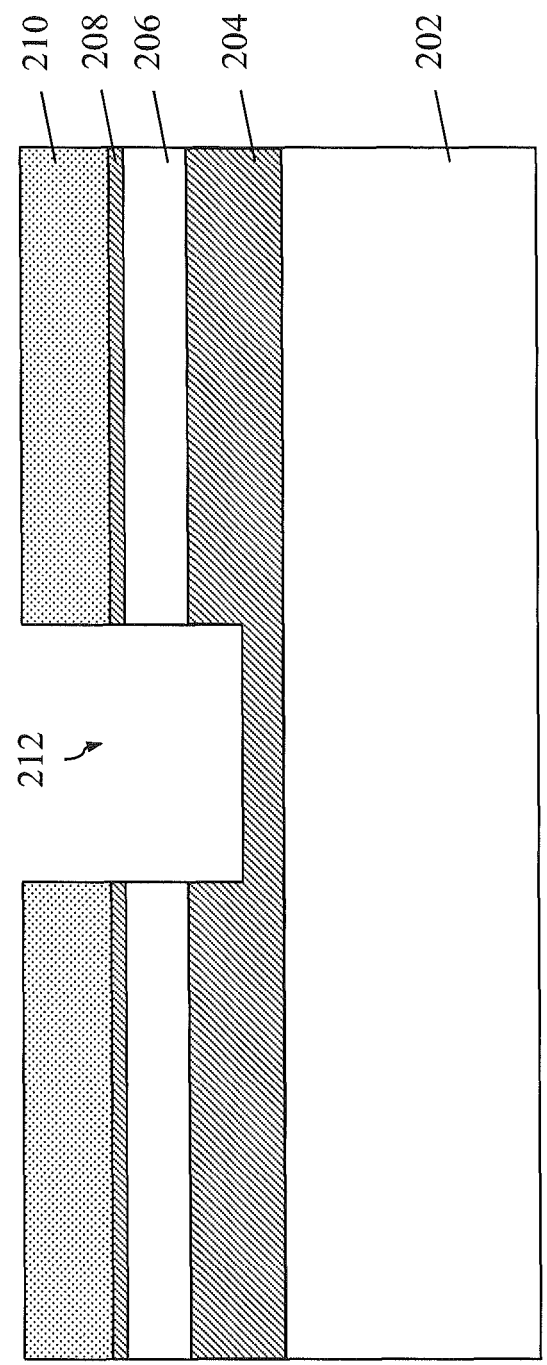
Figure 12:
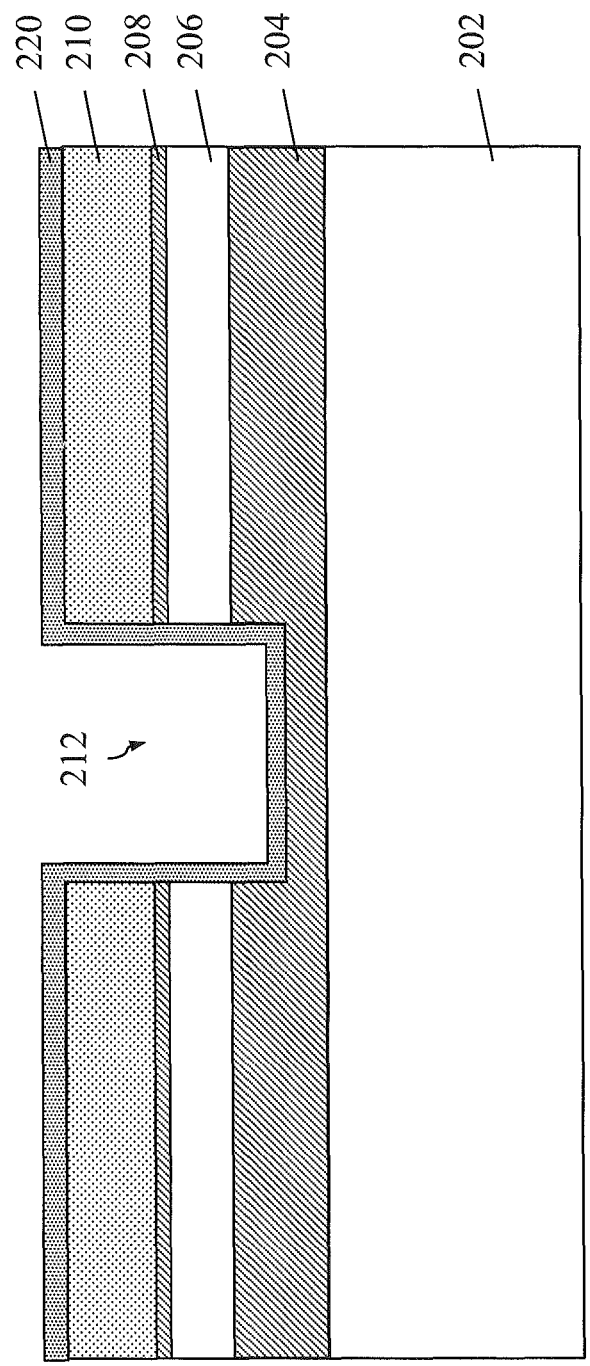
Figure 13:
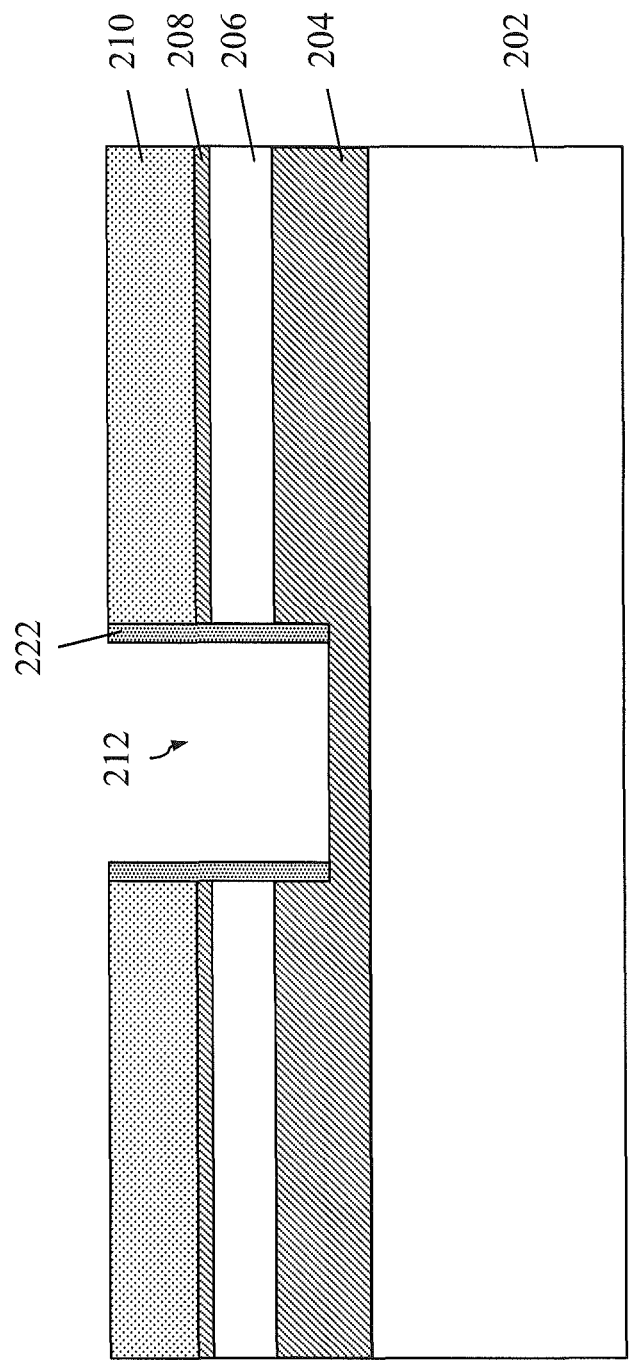

In FIG. 11, a lithographic process is used to form a shallow trench structure 212, similar to FIG. 4. Here, however, the etching is stopped prior to reaching the bulk layer 202, instead stopping at a mid portion of the BOX layer 204. In FIG. 12, a spacer layer material 220 (e.g., a nitride film) is formed over the structure, including over sidewall and bottom surfaces of the shallow trench structure 212. An anisotropic (directional) etch is then used to remove horizontally disposed portions of the spacer layer material 220, thereby forming sidewall spacers 222, as shown in FIG. 13.

Figure 14:
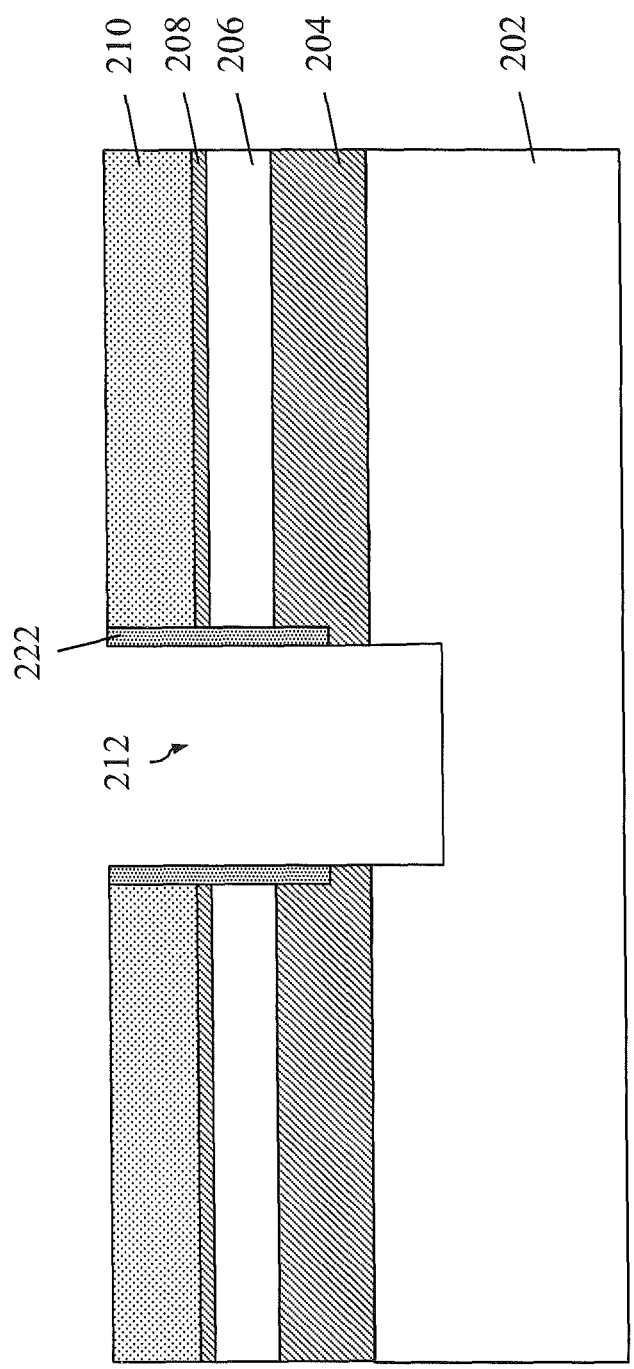
Figure 15:
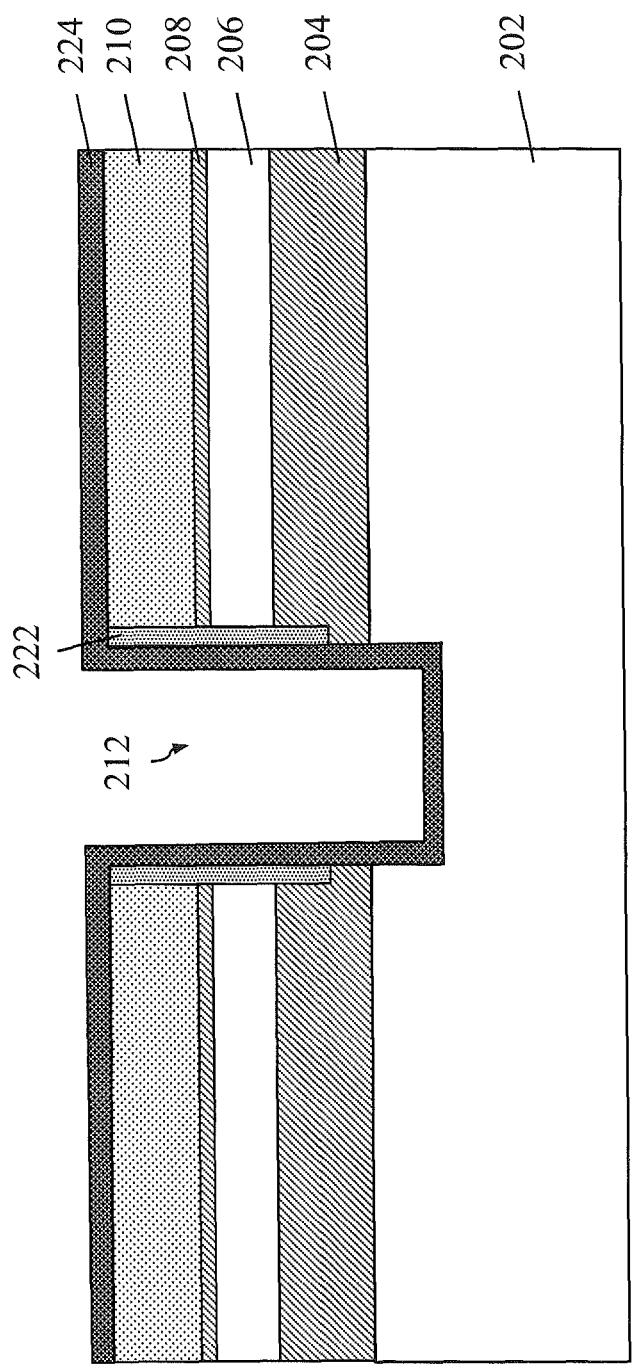
Figure 16:
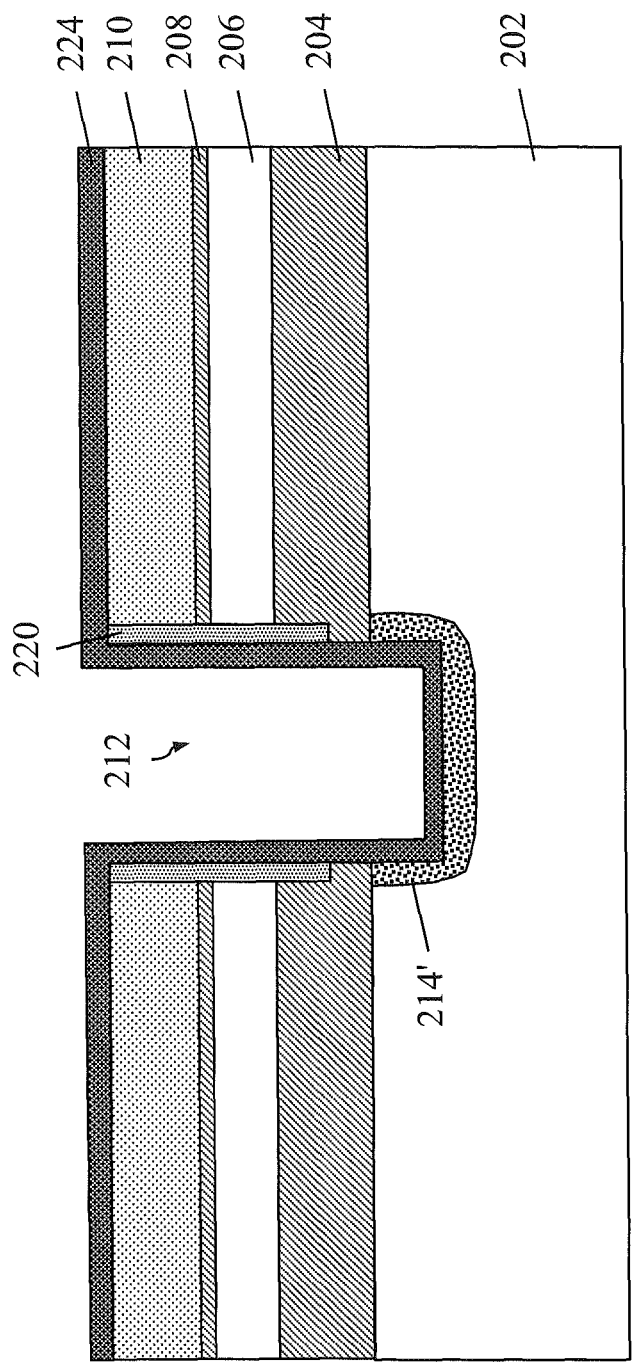

With the sidewall spacers 222 in place, the shallow trench pattern is then etched completely through the BOX layer 204 and into the bulk layer 202, as illustrated in FIG. 14. Then, in FIG. 15, a dopant source layer 224 is formed over the structure of FIG. 14. The dopant source layer 224 may include, for example, an n-typed doped glass material such as arsenic doped silicate. After formation of the dopant source layer 224, the structure is annealed to out-diffuse the dopant atoms into the bulk layer 202 so as to form a diffused doped region 214' in FIG. 16. Similar to the first embodiment, the diffused doped region 214' extends beneath the BOX layer 204 so that subsequent selective etching will define a better recessed portion of a shallow trench structure.

Figure 17:
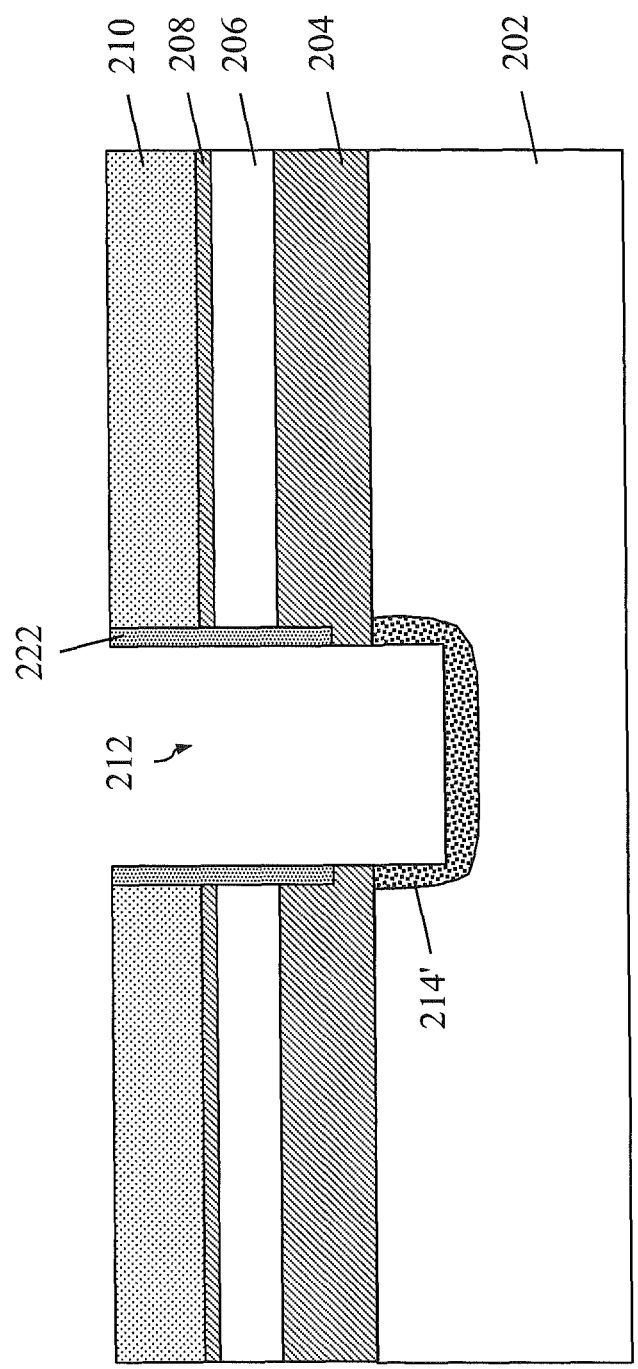
Figure 18:
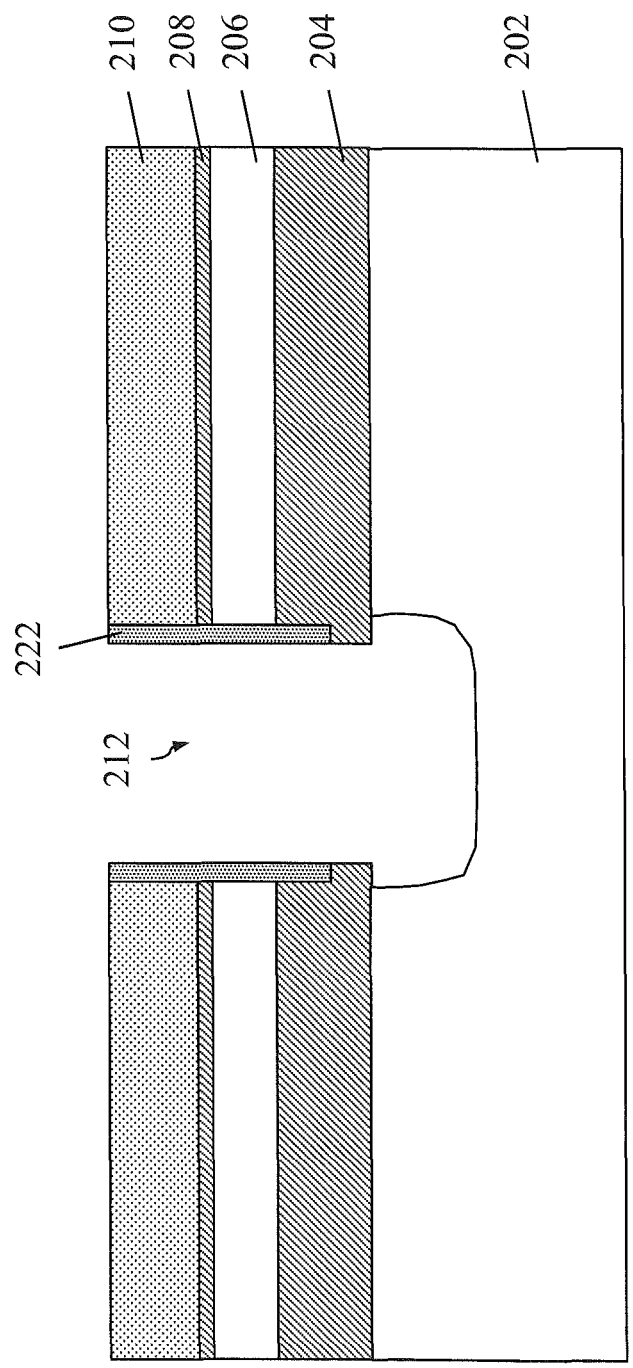

Proceeding to FIG. 17, once the diffused doped region 214' is formed, the dopant source layer 224 may then be removed. Although the sidewall spacers 222 are still illustrated as being present in FIG. 17, they may also optionally be removed if desired. In FIG. 18, the doped region 214' of the bulk layer 202 is selectively etched with respect to the undoped portion, thereby widening the bottom of the shallow trench structure 212 so that it undercuts the BOX layer 204. Similar to the first embodiment, an etch chemistry is selected that may remove n-typed doped silicon selectively with respect to undoped silicon.

Figure 19:
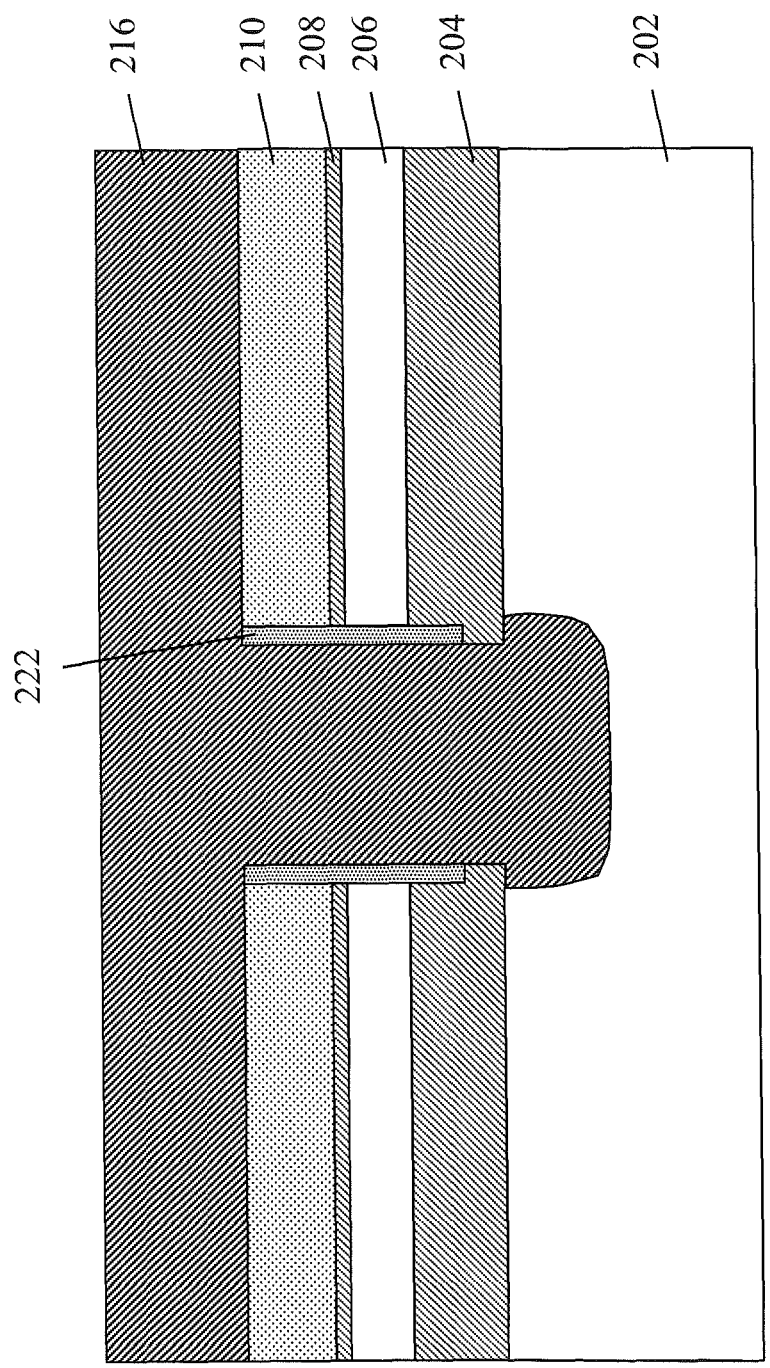
Figure 20:
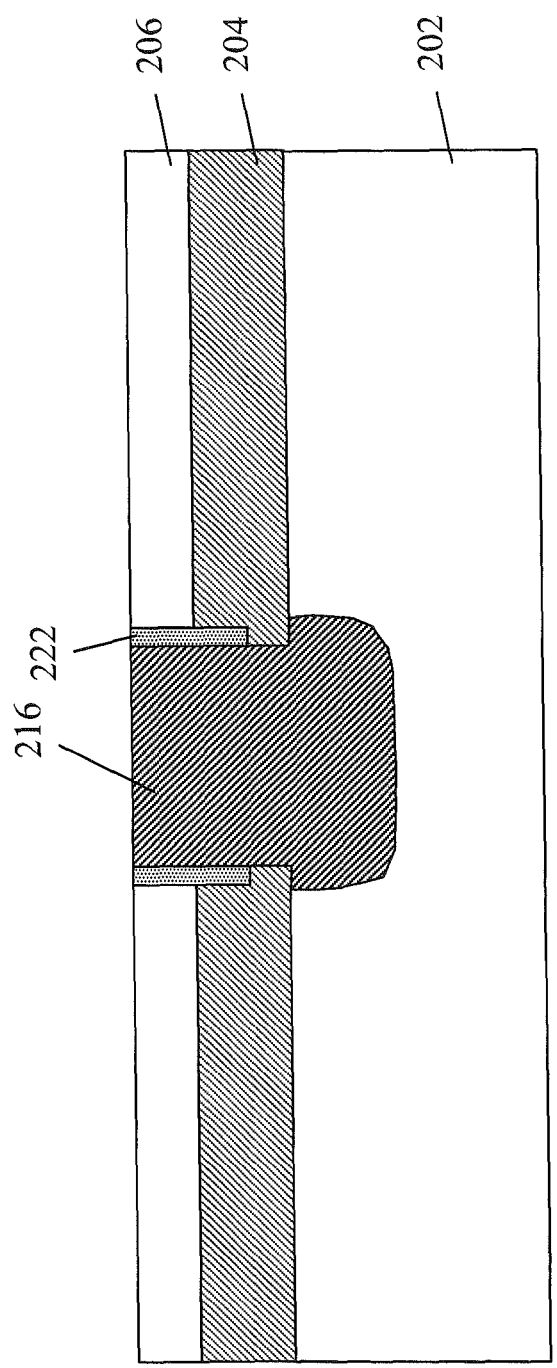
Figure 21:
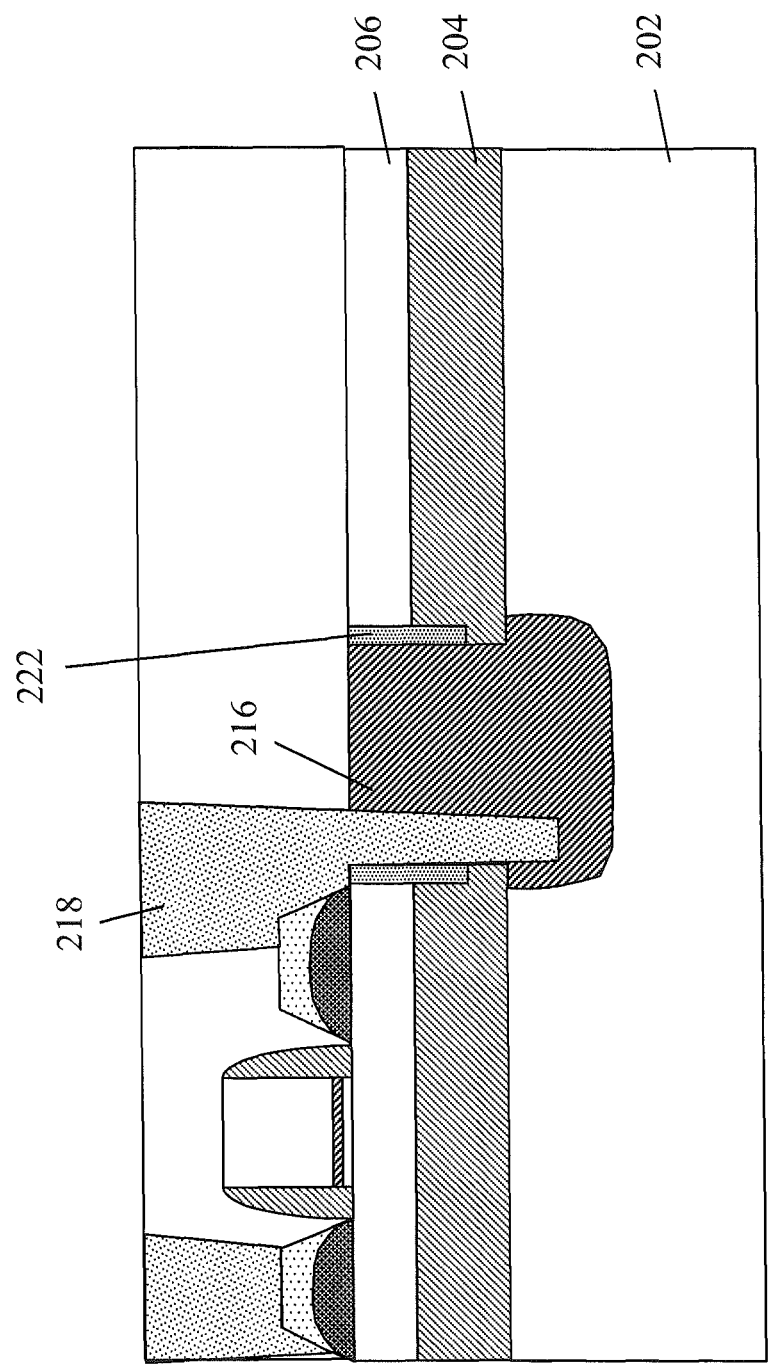

In FIG. 19, a shallow trench insulator fill material 216 (e.g., oxide) is formed within the STI recess and over top surfaces of the structure. This is followed by a planarizing operation (e.g., chemical mechanical polishing (CMP)) to remove excess fill material, as well as the pad nitride layer 210 and pad oxide layer 208, stopping on the SOI layer 206. The resulting structure is depicted in FIG. 20. Finally, as illustrated in FIG. 21, FET and source/drain contact formation is carried out as known in the art. In comparison to FIG. 1, it will be noted that in the case of a slight misalignment of the source/drain contact 218 and/or overetching of STI material 216 at the active area boundary, the increased width of the bottom portion of the STI structure effectively isolates the lower portion of the source/drain contact 218 from shorting to the bulk layer 202. Moreover, since this widened region is formed through selective etching of a diffused doped region (instead of lateral recessing of undoped silicon), the corner region of the lower portion of the STI structure is more reliably defined.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:
1. A method of forming a semiconductor-on-insulator (SOI) device, the method comprising:
defining a shallow trench isolation (STI) structure in an SOI substrate, the SOI substrate including a bulk layer, a buried insulator (BOX) layer over the bulk layer, and an SOI layer over the BOX layer;
forming a doped region in a portion of the bulk layer corresponding to a lower location of the STI structure, the doped region extending laterally into the bulk layer beneath the BOX layer, wherein forming the doped region further comprises:
forming a dopant source layer within the STI structure and on an exposed top surface of the bulk layer; and
annealing to out-diffuse dopant atoms from the dopant source layer and define the doped region;

selectively etching the doped region of the bulk layer with respect to undoped regions of the bulk layer such that the lower location of the STI structure undercuts the BOX layer; and filling the STI structure with an insulator fill material.

2. The method of claim 1, wherein the dopant atoms are n-type dopant atoms.

3. The method of claim 2, wherein the dopant source layer comprises arsenic doped silicate.

4. The method of claim 1, further comprising removing the dopant source layer prior to filling the STI structure with the insulator fill material.

5. A method of forming a semiconductor-on-insulator (SOI) device, the method comprising:

defining a shallow trench isolation (STI) structure in an SOI substrate, the SOI substrate including a bulk layer, a buried insulator (BOX) layer over the bulk layer, and an SOI layer over the BOX layer;

forming a doped region in a portion of the bulk layer corresponding to a lower location of the STI structure, the doped region extending laterally into the bulk layer beneath the BOX layer, the doped region formed by:

initially etching through the SOI layer and a portion of the BOX layer;

forming a spacer layer material within the STI structure;

removing horizontal portions of the spacer material to form sidewall spacers on side surfaces of the SOI layer; and continuing etching through the BOX layer and into the bulk layer prior to forming a dopant source layer;

forming the dopant source layer within the STI structure and on an exposed top surface of the bulk layer; and annealing to out-diffuse dopant atoms from the dopant source layer and define the doped region;

selectively etching the doped region of the bulk layer with respect to undoped regions of the bulk layer such that the lower location of the STI structure undercuts the BOX layer; and filling the STI structure with an insulator fill material.

6. The method of claim 5, wherein the spacer layer material comprises a nitride material.

7. A method of forming a semiconductor-on-insulator (SOI) device, the method comprising:

defining a shallow trench isolation (STI) structure in an SOI substrate, the SOI substrate including a bulk layer, a buried insulator (BOX) layer over the bulk layer, and an SOI layer over the BOX layer, by initially etching through the SOI layer and the BOX layer to expose a top surface of the bulk layer;

forming a doped region in a portion of the bulk layer corresponding to a lower location of the STI structure, the doped region extending laterally into the bulk layer beneath the BOX layer, by implanting a top surface of the bulk layer with dopant atoms and annealing to out-diffuse the dopant atoms;

selectively etching the doped region of the bulk layer with respect to undoped regions of the bulk layer such that the lower location of the STI structure undercuts the BOX layer;

filling the STI structure with an insulator fill material; and following forming the STI structure, forming field effect transistor (FET) devices and FET source/drain contact structures over the SOI substrate, wherein any overlap of a source/drain contact structure with the STI structure is prevented from forming a short circuit to the bulk layer due to the undercutting of the STI structure beneath the BOX layer.

8. The method of claim 7, wherein the dopant atoms are n-type dopant atoms.

9. The method of claim 8, wherein the dopant atoms comprise one or more of phosphorous (P) and arsenic (As).

10. A method of forming a semiconductor-on-insulator (SOI) device, the method comprising:

defining a shallow trench isolation (STI) structure in an SOI substrate, the SOI substrate including a bulk layer, a buried insulator (BOX) layer over the bulk layer, and an SOI layer over the BOX layer;

forming a doped region in a portion of the bulk layer corresponding to a lower location of the STI structure, the doped region extending laterally into the bulk layer beneath the BOX layer, by forming a dopant source layer within the STI structure and on an exposed top surface of the bulk layer and annealing to out-diffuse the dopant atoms from the dopant source layer;

selectively etching the doped region of the bulk layer with respect to undoped regions of the bulk layer such that the lower location of the STI structure undercuts the BOX layer;

filling the STI structure with an insulator fill material; and following forming the STI structure, forming field effect transistor (FET) devices and FET source/drain contact structures over the SOI substrate, wherein any overlap of a source/drain contact structure with the STI structure is prevented from forming a short circuit to the bulk layer due to the undercutting of the STI structure beneath the BOX layer.

11. The method of claim 10, wherein the dopant atoms are n-type dopant atoms.

12. The method of claim 10, wherein the dopant source layer comprises arsenic doped silicate.

13. The method of claim 12, further comprising removing the dopant source layer prior to filling the STI structure with the insulator fill material.

14. A method of forming a semiconductor-on-insulator (SOI) device, the method comprising:

defining a shallow trench isolation (STI) structure in an SOI substrate, the SOI substrate including a bulk layer, a buried insulator (BOX) layer over the bulk layer, and an SOI layer over the BOX layer;

forming a doped region in a portion of the bulk layer corresponding to a lower location of the STI structure, the doped region extending laterally into the bulk layer beneath the BOX layer, the doped region formed by:

initially etching through the SOI layer and a portion of the BOX layer;

forming a spacer layer material within the STI structure;

removing horizontal portions of the spacer material to form sidewall spacers on side surfaces of the SOI layer; and continuing etching through the BOX layer and into the bulk layer; and forming a dopant source layer within the STI structure and on an exposed top surface of the bulk layer and annealing to out-diffuse the dopant atoms from the dopant source layer;

selectively etching the doped region of the bulk layer with respect to undoped regions of the bulk layer such that the lower location of the STI structure undercuts the BOX layer;

filling the STI structure with an insulator fill material; and forming field effect transistor (FET) source/drain contact structures over the SOI substrate, wherein any overlap of a source/drain contact structure with the STI structure is prevented from forming a short circuit to the bulk layer due to the undercutting of the STI structure beneath the BOX layer.

15. The method of claim 14, wherein the spacer layer material comprises a nitride material.

16. The method of claim 14, wherein the sidewall spacers are also formed on side surfaces of a portion of the BOX layer.

* * * * *